United States Patent [19]
Clark

[11] 3,989,542
[45] Nov. 2, 1976

[54] PHOTOGALVANIC DEVICE

[75] Inventor: William Donald Kennedy Clark, Westfield, N.J.

[73] Assignee: Exxon Research and Engineering Company, Linden, N.J.

[22] Filed: Feb. 14, 1975

[21] Appl. No.: 549,962

Related U.S. Application Data

[63] Continuation-in-part of Ser. No. 463,057, April 22, 1974, abandoned.

[52] U.S. Cl. .................................................. 136/89
[51] Int. Cl.² .................... H01L 31/00; H01L 31/04
[58] Field of Search ..................................... 136/89

[56] References Cited
UNITED STATES PATENTS

| | | | |
|---|---|---|---|
| 3,009,006 | 11/1961 | Kostelec | 136/89 |
| 3,031,520 | 4/1962 | Clampitt et al. | 136/89 |
| 3,133,047 | 12/1963 | Lasser et al. | 136/89 X |
| 3,255,044 | 6/1966 | Powers et al. | 136/89 X |
| 3,271,198 | 9/1966 | Winogradoff et al. | 136/89 |
| 3,628,017 | 12/1971 | Lerner | 136/89 X |
| 3,879,228 | 4/1975 | Theodorou | 136/89 X |

FOREIGN PATENTS OR APPLICATIONS

| 150,885 | 3/1961 | U.S.S.R. | 136/89 |
|---|---|---|---|

OTHER PUBLICATIONS

"Photogalvanic output from cells containing Organic Dye", Nature–Physical Science, vol. 244, Aug. 1973, pp. 126–127 Chem. Abstr. 79, 132300p (1973); 80, 43359t (1974).

"Photogalvanic Cells," Electrochimica Acta, vol. 20, pp. 13–20 (1975).

"Photo–Electrochemical Cells," Electrochimica Acta, vol. 5, pp. 1–12 (1961).

*Primary Examiner*—T. Tung
*Assistant Examiner*—Aaron Weisstuch
*Attorney, Agent, or Firm*—Jack Matalon

[57] ABSTRACT

A photogalvanic device adaptable to the conversion of visible light to electrical energy, comprising a light-permeable cell; a light-sensitive electrolyte comprising a solution of a photoreducible dye and a material selected from the group consisting of a salt of iron, a salt of cobalt which is complexed with a chelating agent, and hydroquinone; a first electrode comprising a "N" type semiconductor material; a second electrode comprising an elemental metal having a valence of at least 2; a spacer element separating the first and second electrodes; means to seal the cell; and means for connecting the electrodes to an external circuit; the first and second electrodes are chemically inert to the electrolyte and are in contact therewith.

10 Claims, 4 Drawing Figures

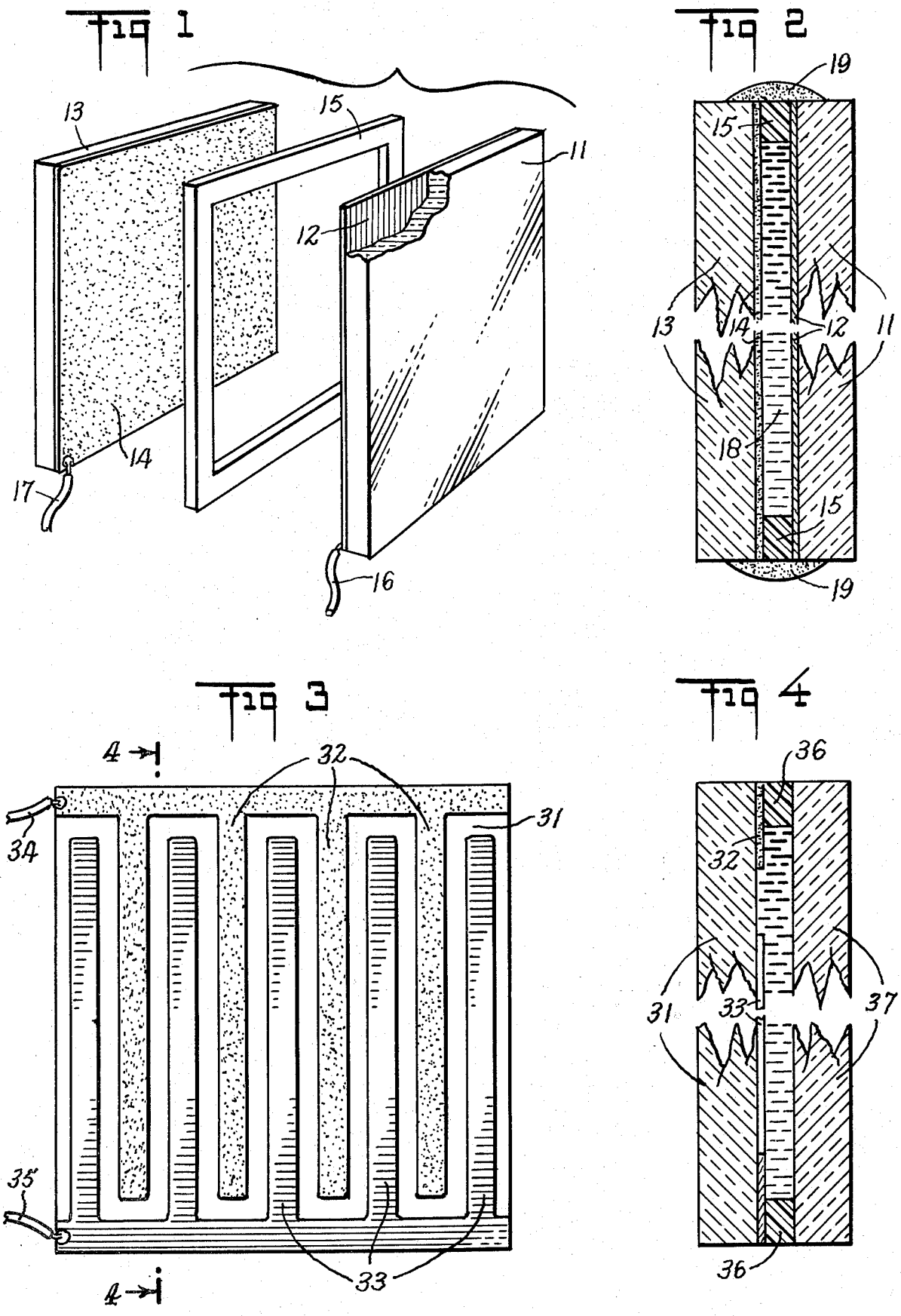

PHOTOGALVANIC DEVICE

The invention described herein was made under a grant with the National Science Foundation, an agency of the United States Government.

RELATED APPLICATIONS

This application is a continuation-in-part of my copending application Ser. No. 463,057, filed Apr. 22, 1974, now abandoned, entitled "Photogalvanic Device".

BACKGROUND OF THE INVENTION

The present invention relates to a photogalvanic device, i.e. a device for the conversion of light to electrical energy.

U.S. Pat. No. 3,255,044 teaches a radiation cell for the conversion of high energy radiation, such as $\alpha, \beta$ or $\gamma$ rays or ultraviolet radiation, into electrical energy. In the cell, the high energy radiation decomposes water with the production of gaseous hydrogen. The gaseous hydrogen formed by this decomposition passes into a gas space within the device and reacts at a catalyzed electrode, positioned at the interface between the gas phase and the liquid electrolyte, to form hydrogen ions with the release of electrons. These electrons pass from the electrode through an external circuit to the cathode of the device where a redox couple, present in the liquid electrolyte, is reduced (e.g. ferric iron present in the solution is reduced to ferrous iron). The cathode immersed in the electrolyte has a high over-voltage for the oxidation of hydrogen to hydrogen ion.

Such a device has numerous disadvantages. First, because of the requirement that water be decomposed with the formation of gaseous hydrogen, the device is sensitive only to radiation energetically sufficient to effect this decomposition. The device cannot, for instance, convert visible light to electrical energy since visible light is of insufficient energy to liberate gaseous hydrogen from water to any significant degree. Further, the device must include a gas-tight vessel in which both a liquid electrolyte phase and a gaseous hydrogen phase are present. Because of the requirements for a gas space and for the anode to be at the liquid-gas interface, severe restrictions are placed on the design of the cell. Further, the anode must be catalytically active towards hydrogen so that a low overvoltage for the oxidation of hydrogen to hydrogen ion is achieved.

The photoreducibility of certain dyes, e.g. thiazine dyes such as thionine (Lauth's violet), is known in the art. For example, E. Rabinowitch has studied the generation of an electric potential by a solution of thionine dye [J. Chem. Phys. 8, 551 (1940); Ibid 8, 560 (1940)] in a cell having one illuminated and one non-illuminated, or dark, electrode. Such cells are also discussed in Technical Documentary Report No ASD-TDR-62-373 published in May 1962 by the Flight Accessories Laboratory, Aeronautical Systems Division, Air Force Systems Command, Wright-Patterson Air Force Base, Ohio. These cells are not practical photogalvanic devices because of the difficulty encountered in constructing such cells wherein one electrode must be illuminated while the other electrode must remain dark.

SUMMARY OF THE PRESENT INVENTION

In contrast to the prior art, new and improved photogalvanic devices have been discovered. These devices are not only sensitive to visible light, which makes them of utility for the conversion of natural daylight to electricity, but are of such compact and simple construction as permits their practical utilization for such energy conversion. In the present invention, it has been found that solutions of photoreducible dyes can be employed in a photogalvanic device in which one or both electrodes are illuminated provided that the electrodes are constructed of the materials set forth below such that they will have a different readinesss to react with light-excited dye species formed in the electrolyte solution when illuminated. Because the need for maintaining one electrode dark is dispensed with, compact cells of simple construction employing the light-sensitive dye solutions as electrolytes can be constructed.

The photogalvanic devices of the present invention comprise:
 a. a light-permeable cell;
 b. a light-sensitive electrolyte comprising:
  1. a solution of a photoreducible dye; and
  2. a material selected from the group consisting of a salt of iron, a salt of cobalt which is complexed with a chelating agent, a hydroquinone;
 c. a first electrode comprising a "N" type semiconductor material having a bandgap greater than 3 electron volts:
 d. a second electrode comprising an elemental metal having a valence state of at least 2;
 e. a spacer element separating said first and second electrodes;
 f. means to seal the cell and exclude air therefrom; and
 g. means for connecting said electrodes to an external circuit, said first and second electrodes being chemically inert to the electrolyte solution and in contact therewith.

DESCRIPTION OF THE DRAWINGS

A better understanding of the present invention and of its many advantages will be had from the following drawings in which FIG. 1 is an exploded perspective view of photgalvanic device according to the present invention;

FIG. 2 is an enlarged cross-sectional view of the assembled photogalvanic device of FIG. 1;

FIG. 3 is a front view of an electrode embodiment for use in a photogalvanic device according to the present invention; and FIG. 4 is an enlarged cross-sectional view of an assembled device employing the electrode of FIG. 3.

FIG. 1 shows, in exploded form, a device according to the present invention comprising first cell wall 11, for example of a non-conducting material such as glass, having first electrode material 12 on the inner surface thereof, for instance deposited as a thin film thereon. The device further comprises second non-conducting (such as glass) cell wall 13 having second electrode material 14 deposited on the inner surface thereof, said second electrode material 14 being different from said first electrode material 12 and being of different redox activity. Cell walls 11 and 13 are separated by chemically and electrically inert separator or spacing element 15. Means 16 and 17, such as metallic wires, are in electrical contact respectively with said first and second electrode materials and provide means for connecting the photogalvanic device to an external circuit.

As can best be seen from FIG. 2 of the drawings, when first and second cell walls 11 and 13 are in tight contact with spacing element 15, they define cell cavity 18 in which is found a light-sensitive electrolyte solution comprising a photoreducible dye (which is preferably deaerated to prevent photo-oxidation of the dye and a suitable redox couple). Electrode materials 12 and 14 are chemically inert to the electrolyte.

If either or both of first electrode material 12 or second electrode material 14 of FIGS. 1 and 2 is a light-permeable material, and is present on a similarly light-permeable material such as glass or clear plastic, the cell can be illuminated through either one or both cell walls and one or both electrode materials to activate the light-sensitive electrolyte solution contained therebetween. If both of the electrode materials and both of the two cell walls are opaque, the electrolyte solution can nevertheless be illuminated by light directed parallel to the cell walls, rather than at an angle incident thereto. In this case, separator or spacing element 15 should be of a light-permeable, i.e. translucent or transparent, material.

For example, a cell of the type shown in FIGS. 1 and 2 can conveniently be manufactured using glass as the material of second cell wall 13, having thereon electrode material 14, for instance a thin film of metallic platinum. First wall 11 may also be of glass having on its interior surface a thin conductive and light-permeable coating of stannic oxide (Nesa glass). The cell walls are separated by a chemically and electrically inert spacing element for instance a material such as "Teflon", polyethylene, "Mylar", or the like. Light incident on such a cell through the Nesa glass element will strike the electrolyte solution contained in the cell cavity formed between the cell walls, causing the generation or an electric current which can be conducted to an external circuit by connecting means 16 and 17. It should be emphasized that in a cell as described both electrodes are illuminated: there is no need for having a so-called "dark electrode".

As mentioned earlier, if opaque materials are used for the cell walls or if both electrode materials are opaque, for example both are thick films, the light-sensitive electrolyte can nonetheless be illuminated by passing lights through the cell in a direction parallel to the cell walls. In this case, the separator should be translucent or transparent.

Finally, as shown in FIG. 2, to seal the cell and to exclude air therefrom (thereby preventing photooxidation of the dye), cell walls 11 and 13 are preferably sealed along their perimeter by application of a bead of adhesive resin 19, for example epoxy resin. If edgeillumination is intended to be employed for the cell, resin 19 should be a translucent or transparent material.

FIG. 3 of the drawings shows a further cell wall embodiment. In this embodiment both electrodes are located on one cell wall so that the remaining cell wall, free of any electrode material, may be of a highly light-permeable material for good illumination of the electrolyte solution in contact with the electrodes.

More in particular, FIG. 3 is a front view showing cell wall 31 of an electrically insulating material such as glass having thereon first electrode material 33 and second, different, electrode material 32. First electrode material 33 may be a metal such as platinum metal. Second electrode material 32 is a different material, of different redox activity toward the photoreducible dye of the electrolyte, and may be a semiconductor. Electrodes 33 and 32 are present in an interlocking finger arrangement to provide a relatively large surface for both electrodes without electrical contact therebetween. The electrodes are provided with means 34 and 35 in electrical connection therewith for connecting the two electrodes to an external circuit.

FIG. 4 is an enlarged cross-sectional view of a cell employing the electrode of FIG. 3. Again, the cell comprises spacing element 36 and a second cell wall 37, which may be of a light-permeable substance such as glass or clear plastic. A cell of this type can be illuminated through light-permeable cell wall 37, with minimum absorption, for photoactivation of the electrode solution contained between the cell walls and confined therein by the spacing element.

The electrolyte solution employed in the cells of the invention is a solution of a photoreducible dye. Such dyes include phenazine dyes such as phenosafranine; xanthene dyes such as eosin and erythrosin; and thiazine dyes such as thionine, methylene blue, toluidine blue, methylene green, methylene azure, thiocarmine R, gentianine, C.I. Basic Blue, C.I. Basic Blue 24, and C.I. Basic Blue 25. Other photoreducible dyes are rhodamine B, Victoria Blue B, and chlorophyll. Among these the thiazine dyes are of particular interest. Such dyes are aniline dyes derived from thiazines, and have the common structure

Also present in the electrolyte is a redox couple, e.g. a salt of iron; a salt of cobalt which is complexed with a chelating agent such as disodium ethylene-diamine tetraacetic acid; or hydroquinone.

Electricity is generated in the cell by reason of reversible photo redox reactions in which the photoreducible dye, for example thionine, is converted by reaction with a photon into the free radical species semi-thionine, while the redox couple, for instance iron (II), is oxidized to a higher valence state, in this case to iron (III):

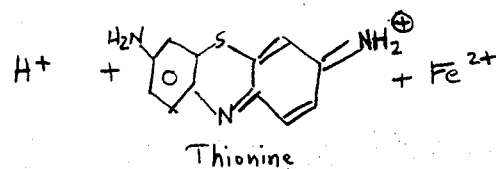

Thionine

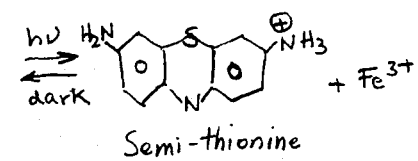

Semi-thionine

Although the overall photoreaction is rendered by the chemical equation given above, the mechanism of the reaction is believed to be quite complex. For example, thionine is activated by a photon to an excited singlet state which converts to an excited triplet state which reacts with ferrous ion to form semi-thionine and ferric ion. In addition to the reverse or dark reaction, two semi-thionine radicals can combine to reform thionine and, additionally, leucothionine:

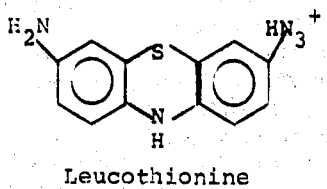

Leucothionine

This reaction is also reversible. Finally, leucothionine may react with ferric ion to form ferrous ion and semithionine. In the thionine-iron system, almost 100 percent efficient electron transfer has been observed after excitation.

The electrolyte solutions employed according to the invention can, in principle, be acid, neutral, or basic. However, when certain redox metal ions are present, e.g. iron, an acid pH may have to be maintained to prevent the precipitation of insoluble hydroxides such as ferric hydroxide. The nature of the anion present in solution, introduced either by the redox couple employed or any acid present, does not appear to have a significant effect on the cell operation. The anion may be sulfate, chloride, perchlorate, or trifluoromethane sulfonate, for instance.

As electrode materials, elements or compounds having different redox activity for the excited dye species are employed. For example, it has been found that using $SnO_2$ and platinum as electrodes in an iron-thionine photogalvanic cell, each electrode develops a different potential with respect to a saturated calomel electrode when the electrodes both are illuminated with the same white light beam. In this case, a larger negative potential is developed at the $SnO_2$ electrode with respect to the calomel electrode, indicating that the reaction

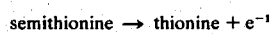
semithionine → thionine + $e^{-1}$ occurs more readily there than at the platinum electrode, whereas the reduction reaction occuring in the cell, namely

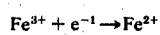
$Fe^{3+} + e^{-1} \rightarrow Fe^{2+}$ is occuring more readily at the platinum electrode.

The first electrode to be used in the cell of this invention comprises "N" semiconductor material having a bandgap greater than 3 electron volts. Preferably the "N" type semiconductor material is selected from compounds of metals and of non-metallic elements of Group VIA of the Periodic Table (given at pp. 58-59 of Lange's *Handbook of Chemistry*, 9th Edition, 1956). Suitable semiconductor materials are sensitive only to electromagnetic radiation of wave lengths less than about 4,000 A. Such compounds include oxides and especially metal oxides, such as zinc oxide, titanium dioxide, antimony trioxide, aluminum oxide, indium trioxide, stannic oxide, bismuth oxide, tantalum oxide as well as metal sulfides such as zinc sulfide. The preferred semiconductor material for use as the first electrode in the present invention is stannic oxide.

The second electrode to be used in the cell of the present invention comprises an elemental metal having a valence state of 2 or more. Suitable elemental metals include gold, platinum, titanium, etc.

When the thiazine dyes of the electrolyte are dissolved in water, the concentration of the dyes is preferably between about $10^{-4}$ and $10^{-5}$ molar. Above a concentration of $10^{-4}$ molar in water, dyes of this type tend to aggregate. However, by admixing an organic solvent such as N, N-dimethylacetamide or acetonitrile with the water, or by dissolving the dye in an organic solvent, higher concentrations of the dye, such as $10^{-2}$ or $10^{-3}$ molar can be employed without aggregation.

In the electrolytes, the concentration of the redox couple may vary over a broader range. For example, in the ferric-ferrous system, the concentration of ferrous ion may be as high as $10^{-1}$ molar, while the concentration of ferric ion can be between $100^{-3}$ and $10^{-5}$ molar, either in water, in organic solvents, or in mixed aqueous-organic solvents.

When utilizing a salt of cobalt which is complexed with a chelating agent, the cobalt salt is mixed with the chelating agent in an amount which is slightly less than the equimolar amounts which would otherwise be required to completely complex the cobalt salt (i.e. one mole of cobalt salt may be mixed with about 0.8 – 0.95 times the number of moles of chelating agent which would otherwise be required to fully complex one mole of the cobalt salt). In the cobaltous-cobaltic system, the concentration of cobaltous ion may be as high as $10^{-1}$ molar while the concentration of cobaltic ion is present at the impurity of the cobaltous salt, either in water, in organic solvents or in mixed aquenous organic solvents.

When utilizing hydroquinone as the redox couple, in the quinone-hydroquinone system, the concentration of hydroquinone ion may be as high as $10^{-1}$ molar, while the concentration of quinone ion can be approximately $10^{-3}$ molar, either in water, in organic solvents, or in mixed aqueous-organic solvents.

The following examples serve to illustrate the photogalvanic device of this invention.

EXAMPLE 1

A cell was constructed with the configuration as shown in FIG. 1. The cell was comprised of two glass microscope slides approximately one square centimeter in area, separated by a "Mylar" separator 4 mils thick, and contained an aqueous solution of thionine dye at a concentration of approximately $5 \times 10^{-5}$ molar, ferrous ion at a concentration of approximately $10^{-2}$ molar, ferric ion at a concentration of approximately $10^{-4}$ molar and hydrogen ion at a concentration of approximately $10^{-2}$ molar. One electrode was metallic platinum deposited as a film (~1000 A) on the interior cell wall of one of the glass slides. The other cell wall was Nesa glass having an electrode coating of stannic oxide (~7 microns thick) on the interior side.

When the cell was illuminated with normal sunlight having an intensity of approximately 100 milliwatts per $cm^2$, the cell developed an open circuit voltage of about 0.15 volt. The short-circuit current, which is dependent on the intensity of illumination, was about 20 microamperes per $cm^2$ for illumination of the intensity mentioned above.

EXAMPLE 2

In this example, the redox couple consisting of a salt of cobalt complexed with a chelating agent was utilized in the cell. $CoCl_2 \cdot 6H_2O$ was mixed with slightly less than equal molar amounts of the disodium salt of ethylene-diamine tetra-acetic acid. The final solution utilized a standard phosphate buffer (pH = 6.00) as a solvent and had a concentration as follows:

$CoCl_2 \cdot 6H_2O = 1.75 \times 10^{-2}$ M; $Na_2EDTA = 1.68 \times 10^{-2}$ M.

To this solution was added thionine solution to give a final dye concentration of $2.0 \times 10^{-5}$ M.

The above solution was utilized in the cell containing the electrodes of the type set forth in Example 1. The open circuit voltage at $10^5$ ohm load was 180 millivolts and the short circuit current was 3 microamperes. This measurement was obtained utilizing a filtered white light source that approximated a sunlight source intensity of approximately 60 milliwatts per square centimeter (the cell and the light source were the same for all measurements).

EXAMPLE 3

In this example, the cell components were the same as those utilized in Example 1 except that the quinone-hydroquinone system was utilized instead of the ferric-ferrous system of Example 1. In this example, solutions of the following concentrations were utilized: hydroquinone = $3.6 \times 10^{-2}$ M, quinone = saturated solution, thionine = $1.6 \times 10^{-4}$ M, hydrogen ion = $1 \times 10^{-2}$ N with trifluormethane sulfonate acid. The open circuit voltage was 45 millivolts and the short circuit current was 13.5 microamps when the cell was illuminated with the above filtered light source having an intensity of approximately 60 milliwatts per square centimeter.

EXAMPLE 4

This example serves to illustrate the use of a polyelectrolyte membrane instead of the separator described above. The cell was constructed with the same components and solutions as utilized in Example 1, except that instead of the separator, the electrolyte solution was utilized to soak a polyelectrolyte membrane. The soaked polyelectrolyte membrane prevented the electrodes from shorting electrically and eliminated the need for "Mylar" separators. Furthermore, the soaked membrane was flexible, thus allowing for the possiblity of depositing electrode materials onto flexible substrates and accordingly permitting the construction of a flexible photogalvanic cell.

The polyelectrolyte membranes utilized in this example were supplied by the Amicon Corporation of Lexington, Mass. Two types of polyelectrolyte membranes were utilized, one having an excess of sulfonated styrene groups ("BA-70") and the other having no ion exchange capacity ("BN-70"). Both membranes were soaked in a solution of the composition $FeSO_4 = 3 \times 10^{-2}$ M, $H_2SO_4 = 10^{-2}$ N, thionine = $4 \times 10^{-5}$ M and $Fe_2(SO_4)_3$ corresponding to impurity level in the ferrous salt.

The "BA-70" film was very strongly dyed owing to the presence of excess $SO_3$ groups and was almost opaque blue in appearance. The membranes were sandwiched between the following electrode pairs and were illuminated with a white light source having an intensity of approximately 100 milliwatts per square centimeter: for the electrode pair consisting of stannic oxide-platinum in conjunction with soaked membrane "BA-70", an open circuit voltage of 60 millivolts and a short circuit current of 20 microamperes was obtained. When utilizing an electrode pair consisting of two electrodes of stannic oxide together with soaked membrane "BA-70", the open circuit voltage was 40 millivolts and the short circuit current was 5 microamperes. When utilizing the electrode pair consisting of stannic oxide and platinum in conjunction with soaked membrane "BN-70", an open circuit voltage of 16 millivolts and a short circuit current of 1 microamperes was obtained.

What is claimed is:
1. A photogalvanic device comprising:
   a. a light-permeable cell;
   b. a light-sensitive liquid electrolyte comprising:
      1. a solution of a photoreducible dye; and
      2. a material selected from the group consisting of a salt of iron, a salt of cobalt which is complexed with a chelating agent, and hydroquinone.
   c. a first electrode comprising a "N" type semiconductor material having a bandgap greater than 3 electron volts;
   d. a second electrode comprising an elemental metal having a valence state of at least 2;
   e. a spacer element separating said first and second electrodes;
   f. means to seal the cell and exclude air therefrom; and
   g. means for connecting said electrodes to an external circuit, said first and second electrodes being chemically inert to the electrolyte solution and in contact therewith.
2. A device as in claim 1 wherein said photoreducible dye is a thiazine dye.
3. A device as in claim 1 wherein the "N" type semiconductor material is a compound consisting of a metal and a Group VIA non-metal.
4. The device as in claim 3 wherein the "N" type semiconductor material is stannic oxide.
5. The device as in claim 1 wherein the second electrode consists of platinum.
6. A device as in claim 1 wherein said material present in the electrolyte is a salt of iron.
7. A device as in claim 1 wherein the material present in said electrolyte is a salt of cobalt complexed with the disodium salt of ethylene-diamine tetra-acetic acid.
8. The device as in claim 1 wherein the material present in the electrolyte is hydroquinone.
9. A device as in claim 1 wherein the spacer element is a polyelectrolyte membrane.
10. The device as in claim 1 wherein the light-sensitive electrolyte consists of a solution of thionine and an iron salt, the first electrode consists of stannic oxide and the second electrode consists of platinum.

* * * * *